US012597934B2

(12) United States Patent　　　(10) Patent No.:　US 12,597,934 B2
Choi et al.　　　　　　　　　　　　 (45) Date of Patent:　　　Apr. 7, 2026

(54) CLOCK DATA RECOVERY CIRCUIT AND APPARATUS INCLUDING THE SAME

(71) Applicant: SAMSUNG ELECTRONICS CO., LTD., Suwon-si (KR)

(72) Inventors: Wooseok Choi, Seoul-si (KR); Jihee Kim, Seoul-si (KR)

(73) Assignees: SAMSUNG ELECTRONICS CO., LTD., Suwon-si (KR); Seoul National University R&DB Foundation, Seoul (KR)

( * ) Notice: Subject to any disclaimer, the term of this patent is extended or adjusted under 35 U.S.C. 154(b) by 52 days.

(21) Appl. No.: 18/809,966

(22) Filed: Aug. 20, 2024

(65) Prior Publication Data

US 2025/0105848 A1　　Mar. 27, 2025

(30) Foreign Application Priority Data

Sep. 26, 2023　　(KR) ........................ 10-2023-0129459

(51) Int. Cl.
　H03L 7/08　　　(2006.01)
　H03L 7/091　　(2006.01)
　H03L 7/099　　(2006.01)
(52) U.S. Cl.
　CPC ............ H03L 7/0807 (2013.01); H03L 7/091 (2013.01); H03L 7/0998 (2013.01)
(58) Field of Classification Search
　CPC ..... H03L 7/0807; H03L 7/091; H03L 7/0998; H04L 7/033; H04L 7/0025; H04L 7/0331
　See application file for complete search history.

(56) References Cited

U.S. PATENT DOCUMENTS

| | | | | |
|---|---|---|---|---|
| 8,860,467 | B2 * | 10/2014 | Malipatil | ................ H03L 7/091 |
| | | | | 327/3 |
| 8,929,497 | B2 | 1/2015 | Chmelar et al. | |
| 9,166,771 | B2 | 10/2015 | Shibasaki | |
| 10,103,911 | B2 * | 10/2018 | Shibasaki | ............. H04L 25/063 |
| 10,142,089 | B2 | 11/2018 | Yao et al. | |
| 10,211,972 | B2 | 2/2019 | Ramezani et al. | |
| 10,432,389 | B2 | 10/2019 | Lee et al. | |
| 11,038,725 | B2 | 6/2021 | Hossain et al. | |
| 11,070,352 | B2 * | 7/2021 | Kawasoe | ............ H04L 25/4917 |
| 11,469,877 | B1 | 10/2022 | Raj et al. | |
| 2007/0075759 | A1 * | 4/2007 | Metz | ..................... H04L 7/0037 |
| | | | | 327/158 |

(Continued)

OTHER PUBLICATIONS

Fulvio Spagna et al., "A 78mW 11.8Gb/s Serial Link Transceiver with Adaptive RX Equalization and Baud-Rate CDR in 32nm CMOS", 2010 IEEE International Solid-State Circuits Conference, 3 pages.

(Continued)

*Primary Examiner* — Sophia Vlahos

(74) *Attorney, Agent, or Firm* — Morgan, Lewis & Bockius LLP

(57)　　　　　　ABSTRACT

A clock data recovery circuit including: a sampler to sample a comparison result between an input data signal and multiple reference voltages or to sample the input data signal based on a recovered clock signal; and a control circuit to output a control signal for controlling a phase of the recovered clock signal based on a K signal, an up signal, and a down signal.

20 Claims, 13 Drawing Sheets

(56) References Cited

U.S. PATENT DOCUMENTS

| | | | |
|---|---|---|---|
| 2016/0072650 A1* | 3/2016 | Mobin | H04L 7/0087 |
| | | | 375/376 |
| 2016/0099819 A1* | 4/2016 | Ogata | H04B 1/16 |
| | | | 375/233 |
| 2022/0190999 A1 | 6/2022 | Ju et al. | |
| 2022/0231889 A1 | 7/2022 | Zhang et al. | |
| 2022/0311449 A1 | 9/2022 | Tachibana | |

OTHER PUBLICATIONS

Moon-Chul Choi et al., "A 0.1-pJ/b/dB 28-GB/s Maximum-Eye Tracking, Weight-Adjusting MM CDR and Adaptive DFE with Single Shared Error Sampler", 2020 IEEE, 3 pages.

Yi-Chieh Huang et al., "An 8b Injection-Locked Phase Rotator with Dynamic Multiphase Injection for 28/56/112Gb/s Serdes Application", 2019 IEEE International Solid-State Circuits Conference, 3 pages.

Hye-Yoon Joo et al., "A Maximum-Eye-Tracking CDR With Biased Data-Level and Eye Slope Detector for Near-Optimal Timing Adaptation", 2020 IEEE, pp. 1-13.

Kurt H. Mueller et al., "Timing Recovery in Digital Synchronous Data Receivers", IEEE Transactions on Communications, vol. COM-24, No. 5, May 1976, pp. 516-531.

* cited by examiner

| | $D_{n-1}$ | $D_n$ | $E_{n-1}$ | $E_n$ | PD |
|---|---|---|---|---|---|
| △ | 1 | 1 | −1 | −1 | DN |
| ▲ | 1 | 1 | 1 | −1 | UP |
| ● | −1 | 1 | − | 1 | UP |
| ○ | 1 | −1 | 1 | − | DN |

FIG. 7A

| CLK phase | Pdlev | k |
|---|---|---|
| Delayed (CLK_d) ◇ → □ | Increased | − |
| | Decreased | + |
| Restored (CLK) □ → ◇ | Increased | + |
| | Decreased | − |

CLOCK DATA RECOVERY CIRCUIT AND APPARATUS INCLUDING THE SAME

CROSS-REFERENCE TO RELATED APPLICATION

This application claims priority under 35 U.S.C. § 119 to Korean Patent Application No. 10-2023-0129459, filed on Sep. 26, 2023, in the Korean Intellectual Property Office, the disclosure of which is incorporated by reference herein in its entirety.

TECHNICAL FIELD

The inventive concept relates to an electronic device, and more particularly, to a clock data recovery circuit for recovering a clock and data from serial data, and an apparatus including the same.

DISCUSSION OF RELATED ART

Serial communication methods can transmit data at high speed and are utilized not only for communication between independent devices through detachable ports but also in a variety of applications. These applications include communication between system components, and data movement within an integrated circuit.

Clock data recovery circuits generate recovered clock signals from serial data by detecting the phase of the clock embedded in the serial data. They then use the recovered clocks to generate the recovered data from the serial data. These clock data recovery circuits are applicable in a wide range of devices and applications that employ serial communication methods to transmit and receive data.

To adjust the timing of clock signals with low power consumption, clock signal phase detection methods such as Mueller-Muller phase detection (MMPD), which is primarily employed in Baud-rate Clock Data Recovery (CDR), are used. However, these methods can lead to a deterioration in vertical eye margin (VEM) and bit error rate (BER) due to a sub-optimal locking point (e.g., not an optimal locking point) at which $h_1 = h_{-1}$.

SUMMARY

Embodiments of the inventive concept provide a clock data recovery circuit that obtains the maximum value of an eye height by adjusting a value of K which adjusts a ratio between an up signal and a down signal, and an operation method thereof.

According to an embodiment of the inventive concept, there is provided a clock data recovery circuit including: a sampler configured to sample a comparison result between an input data signal and multiple reference voltages or to sample the input data signal based on a recovered clock signal; and a control circuit configured to output a control signal for controlling a phase of the recovered clock signal based on a K signal, an up signal, and a down signal, wherein the sampler includes: a first sampler configured to output a data sample signal by sampling the input data signal at an edge of the recovered clock signal; a second sampler configured to output an error signal by comparing a voltage level of the input data signal with a first reference voltage at the edge of the recovered clock signal; and a third sampler configured to output an eye monitoring signal by comparing the voltage level of the input data signal with a second reference voltage at the edge of the recovered clock signal or an edge of a delayed recovered clock signal, and the control circuit includes: a phase detector configured to output the up signal or the down signal based on the data sample signal and the error signal; a first logic configured to output the K signal based on the data sample signal and the eye monitoring signal; a second logic configured to output a phase error signal based on the K signal, the up signal, and the down signal; and a phase interpolator (PI) code generator configured to output the control signal based on the phase error signal.

According to an embodiment of the inventive concept, there is provided an apparatus including: a reception circuit; and a transmission circuit configured to transmit an input data signal to the reception circuit through a channel, wherein the reception circuit includes: a sampler configured to sample a comparison result between the input data signal and multiple reference voltages or to sample the input data signal based on a recovered clock signal; and a control circuit configured to output a control signal for controlling a phase of the recovered clock signal based on a K signal, an up signal, and a down signal, wherein the sampler includes: a first sampler configured to output a data sample signal by sampling the input data signal at an edge of the recovered clock signal; a second sampler configured to output an error signal by comparing a voltage level of the input data signal with a first reference voltage at the edge of the recovered clock signal; and a third sampler configured to output an eye monitoring signal by comparing the voltage level of the input data signal with a second reference voltage at the edge of the recovered clock signal or an edge of a delayed recovered clock signal, and the control circuit includes: a phase detector configured to output the up signal or the down signal based on the data sample signal and the error signal; a first logic configured to output the K signal based on the data sample signal and the eye monitoring signal; a second logic configured to output a phase error signal based on the K signal, the up signal, and the down signal; and a P) code generator configured to output the control signal based on the phase error signal.

According to an embodiment of the inventive concept, there is provided a phase detector including: a phase detection circuit configured to output an up signal or a down signal based on a data sample signal and an error signal; a first circuit configured to output a K signal based on the data sample signal and an eye monitoring signal; and a second circuit configured to output a phase error signal based on the K signal, the up signal, and the down signal.

BRIEF DESCRIPTION OF THE DRAWINGS

Embodiments of the inventive concept will be more clearly understood from the following detailed description taken in conjunction with the accompanying drawings in which:

FIG. 2 is a block diagram illustrating a clock data recovery circuit according to an embodiment;

FIGS. 4A and 4B are diagrams for describing operations of a phase detector according to an embodiment;

FIGS. 7A, 7B and 7C are diagrams for describing operations of a clock data recovery circuit according to an embodiment;

DETAILED DESCRIPTION OF THE EMBODIMENTS

Hereinafter, embodiments of the inventive concept are described in detail with reference to the accompanying drawings.

Figure 1:
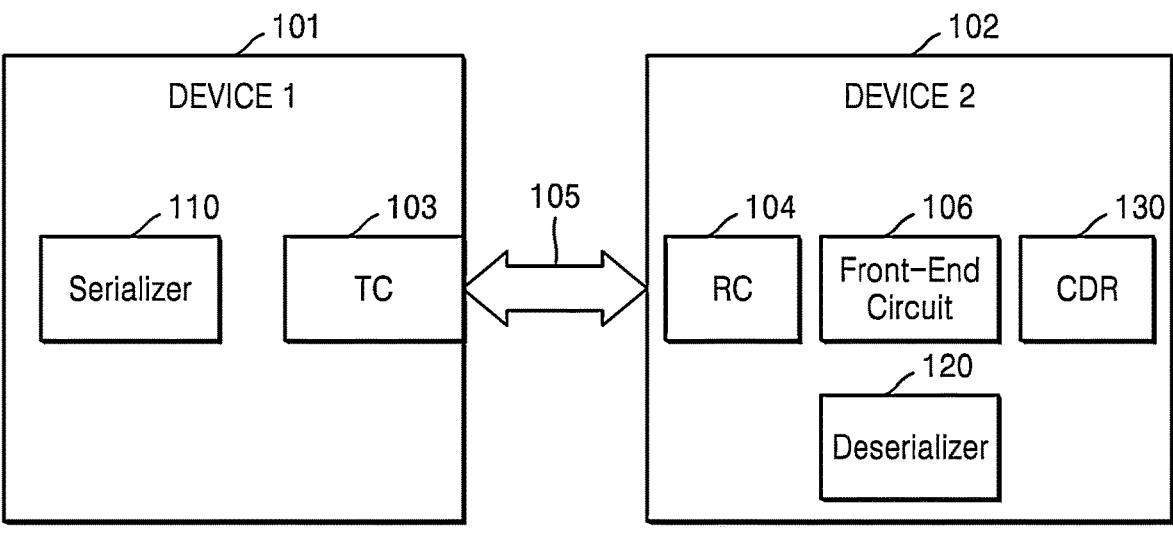
FIG. 1 is a block diagram illustrating a data transmitting/receiving system according to an embodiment.

FIG. 1 is a block diagram illustrating a data transmitting/receiving system according to an embodiment.

Referring to FIG. 1, the data transmitting/receiving system may include a first device (DEVICE 1) 101, a second device (DEVICE 2) 102 and a transmission line 105. As a subject that transmits data, the first device 101 may transmit data to the second device 102 via the transmission line 105 through a transmission circuit (TC) 103. In an embodiment, the first device 101 may only deliver data to the second device 102, may transmit the data encoded by performing a separate encoding, or may transmit a recovered clock signal together with the data.

According to an embodiment, the first device 101 may further include a serializer 110. The serializer 110 may divide the data to be transmitted to the second device 102 according to pre-designated units and transmit the divided data as burst data according to a high-speed serial interface.

As a subject that receives data, the second device 102 may receive the data transmitted from the first device 101 through the transmission line 105 and a reception circuit (RC) 104. For example, the reception circuit 104 may receive an input data signal from outside (e.g., the first device 101) through the transmission line 105.

In an embodiment, the second device 102 may further include a decoder for decoding the encoded data. In various embodiments, the first device 101 may be referred to as a transmitting device, and the second device 102 may be referred to as a receiving device.

According to an embodiment, the second device 102 may further include a front-end circuit 106. The front-end circuit 106 may receive the input data signal from the reception circuit 104. Here, an input signal may be in the form of a differential signal pair. In addition, the front-end circuit 106 may compensate for channel loss or inter-symbol interference (ISI) and output the compensated input data signal. Here, the front-end circuit 106 may include a continuous time linear equalizer (CTLE) and a decision feedback equalizer (DFE) configured with multiple stages.

According to an embodiment, the second device 102 may further include a deserializer 120. The deserializer 120 may receive the input data signal including a bit sequence and generate an output data signal including parallel data.

According to an embodiment, the second device 102 may further include a clock data recovery circuit (CDR) 130. The clock data recovery circuit 130 may receive the input data signal that the first device 101 transmits in a serial communication method, and generate the output data signal from the input data signal. Here, the output data signal may be referred to as a recovered data signal. The input data signal may include a series of bits, e.g., a bit sequence. For example, the input data signal may include a packet of m bits that are sequentially enumerated. In other words, the input data signal may include a packet containing m bits that are arranged in a sequential order. The clock data recovery circuit 130 may recognize serial data included in the input data signal by sampling the bit sequence included in the input data signal, and generate the output data signal including the parallel data from the serial data.

According to an embodiment, the input data signal may include a clock and the serial data. The first device 101 can output the input data signal, which includes the serial data, through the transmission line 105. Additionally, a clock signal may be separately output through a clock line which is separate from the transmission line 105. In another embodiment, the first device 101 may include the clock in the input data signal, and the second device 102 may recognize the serial data by recovering the clock included in a data signal. The second device 102 may recover the clock including a change in the data signal, thereby sampling the bit sequence, and accordingly, improvements in the rate of data transmission may be achieved. The clock included in the input data signal may be referred to as an embedded clock.

In various embodiments, the transmission line 105 may be referred to in various terms including a transmission channel and a data channel. In addition, as shown in FIG. 1, the transmission line 105 is illustrated as a line for physical or electrical connections, but is not limited thereto. According to various embodiments, the transmission line 105 may refer to a channel through which data is transmitted wirelessly (e.g., through air).

Figure 2:
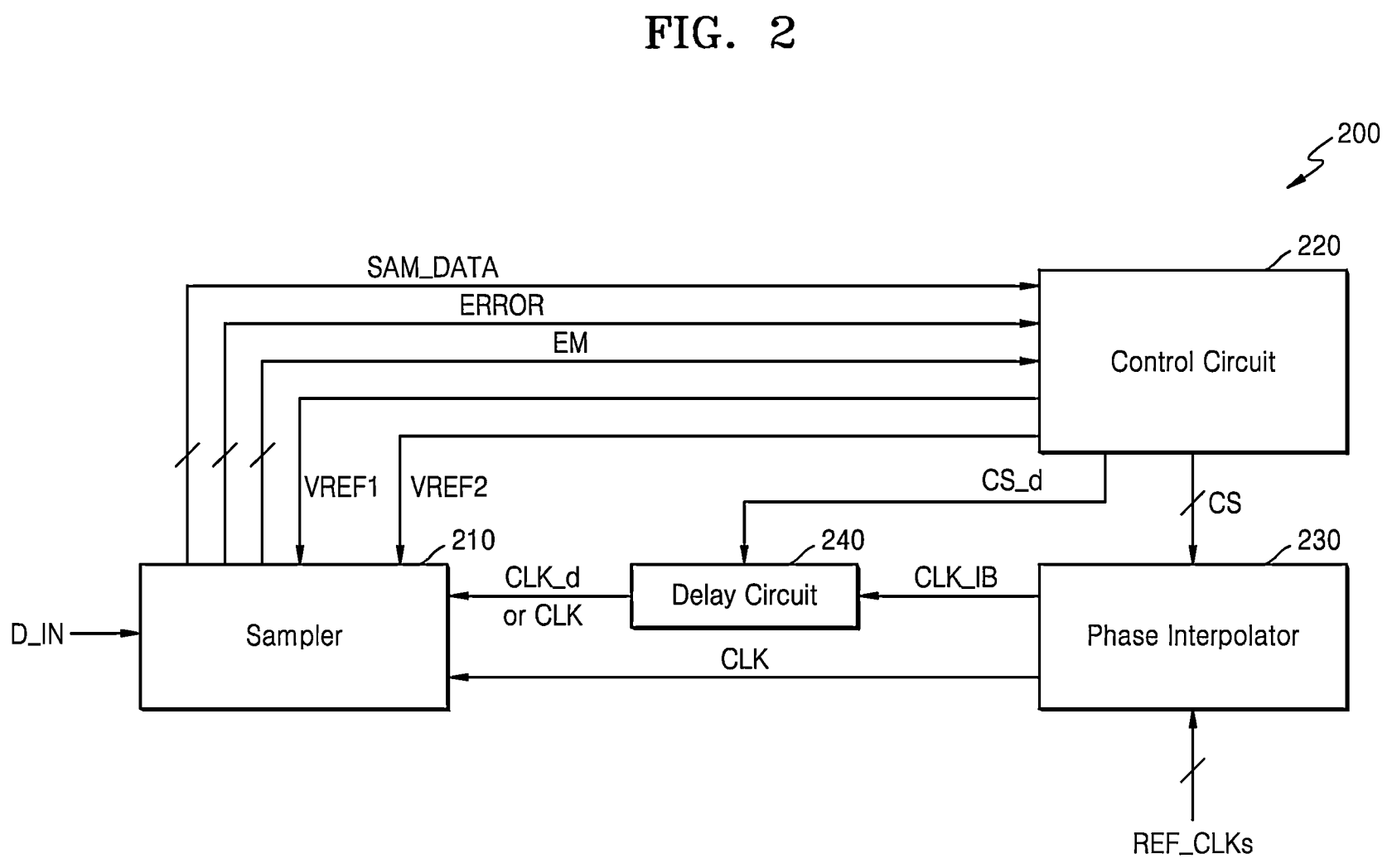

FIG. 2 is a block diagram illustrating a clock data recovery circuit 200 according to an embodiment.

The clock data recovery circuit 200 may receive an input data signal D_IN that a transmission circuit (or a transmitter) transmits in a serial communication method. The clock data recovery circuit 200 may generate a recovered clock signal CLK from the input data signal D_IN, and generate a recovered data signal after sampling the input data signal D_IN with the recovered clock signal CLK.

The clock data recovery circuit 200 may generate the recovered clock signal CLK based on a control signal CS that controls a phase of the recovered clock signal CLK. In addition, the clock data recovery circuit 200 may generate a delayed recovered clock signal CLK_d by delaying the phase of the recovered clock signal CLK within one unit interval (UI). In this specification, the recovered clock signal CLK or the delayed recovered clock signal CLK_d may be referred to as a sampling clock signal which is used in a sampling operation.

Referring to FIG. 2, the clock data recovery circuit 200 may include a sampler 210, a control circuit 220, a phase interpolator 230, and a delay circuit 240.

The sampler 210 may receive the input data signal D_IN from outside (e.g., a transmission circuit or a transmitter). As an example, the sampler 210 may receive the input data signal D_IN through a serial data link or other types of data links. In some embodiments, the input data signal D_IN may be provided to the sampler 210 after preprocessing such as equalization, amplification and filtering.

The sampler 210 may receive a sampling clock. As an example, the sampler 210 may receive the recovered clock signal CLK from the phase interpolator 230. In addition, the sampler 210 may receive the delayed recovered clock signal CLK_d or the recovered clock signal CLK from the delay circuit 240.

The sampler 210 may sample the input data signal D_IN according to the recovered clock signal CLK and output a data sample signal SAM_DATA. In addition, in response to an edge of the recovered clock signal CLK or an edge of the delayed recovered clock signal CLK_d, the sampler 210 may output sample signals (for example, ERROR, EM) indicating a comparison result between a voltage level of the input data signal D_IN and multiple reference voltages (for example, a first reference voltage VREF1, a second reference voltage VREF2). Here, the sampler 210 may provide the sample signals to the control circuit 220.

For example, the sampler 210 may sample the input data signal D_IN at a rising edge of the recovered clock signal CLK and output the data sample signal SAM_DATA. In addition, the sampler 210 may compare the voltage level of the input data signal D_IN with the first reference voltage VREF1 at the rising edge of the recovered clock signal CLK and output an error signal ERROR indicating a result of the comparison. In addition, the sampler 210 may compare the voltage level of the input data signal D_IN with the second reference voltage VREF2 at the rising edge of the recovered clock signal CLK or a rising edge of the delayed recovered clock signal CLK_d and output an eye monitoring signal EM indicating a result of the comparison. The first reference voltage VREF1 and the second reference voltage VREF2 may be provided by the control circuit 220. This will be described in detail later.

The sampler 210 may perform a plurality of sampling operations, and may output a plurality of the sample signals through the plurality of sampling operations. Here, the sample signals may include the data sample signal SAM_DATA, the error signal ERROR and the eye monitoring signal EM. For example, the sampler 210 may output a plurality of the data sample signals SAM_DATA, a plurality of the error signals ERROR and a plurality of the eye monitoring signals EM through the plurality of sampling operations.

The control circuit 220 may generate the control signal CS for controlling the phase of the recovered clock signal CLK based on the sample signals and provide the control signal CS to the phase interpolator 230. In addition, the control circuit 220 may generate a delay circuit control signal CS_d for controlling an output of the delay circuit 240 based on the sample signals and provide the delay circuit control signal CS_d to the delay circuit 240.

The phase interpolator 230 may receive reference clock signals REF_CLKs as an input value, and may output the recovered clock signal CLK based on the reference clock signals REF_CLKs. In an embodiment, the reference clock signals REF_CLKs may include four clock signals with a phase difference of 90 degrees from each other.

In addition, the phase interpolator 230 may regulate the phase of the recovered clock signal CLK based on the control signal CS, and may provide the sampler 210 or the delay circuit 240 with the recovered clock signal CLK whose phase is regulated.

The delay circuit 240 may generate the delayed recovered clock signal CLK_d by delaying the phase of the recovered clock signal CLK within one unit interval of the phase interpolator 230. In addition, the delay circuit 240 may provide the recovered clock signal CLK or the delayed recovered clock signal CLK_d to the sampler 210 based on the delay circuit control signal CS_d.

In the same way as above, a loop operation implemented by the sampler 210, the control circuit 220, the phase interpolator 230, and the delay circuit 240 may be performed a plurality of times and, as a result, the phase of the recovered clock signal CLK may be determined. The recovered clock signal CLK with the phase determined may be used in the sampling operations for the input data signal D_IN processed by a processing circuit.

Determining the phase of the recovered clock signal CLK may be referred to as locking, and a sampling timepoint of the recovered clock signal CLK may be referred to as a locking point.

Figure 3:
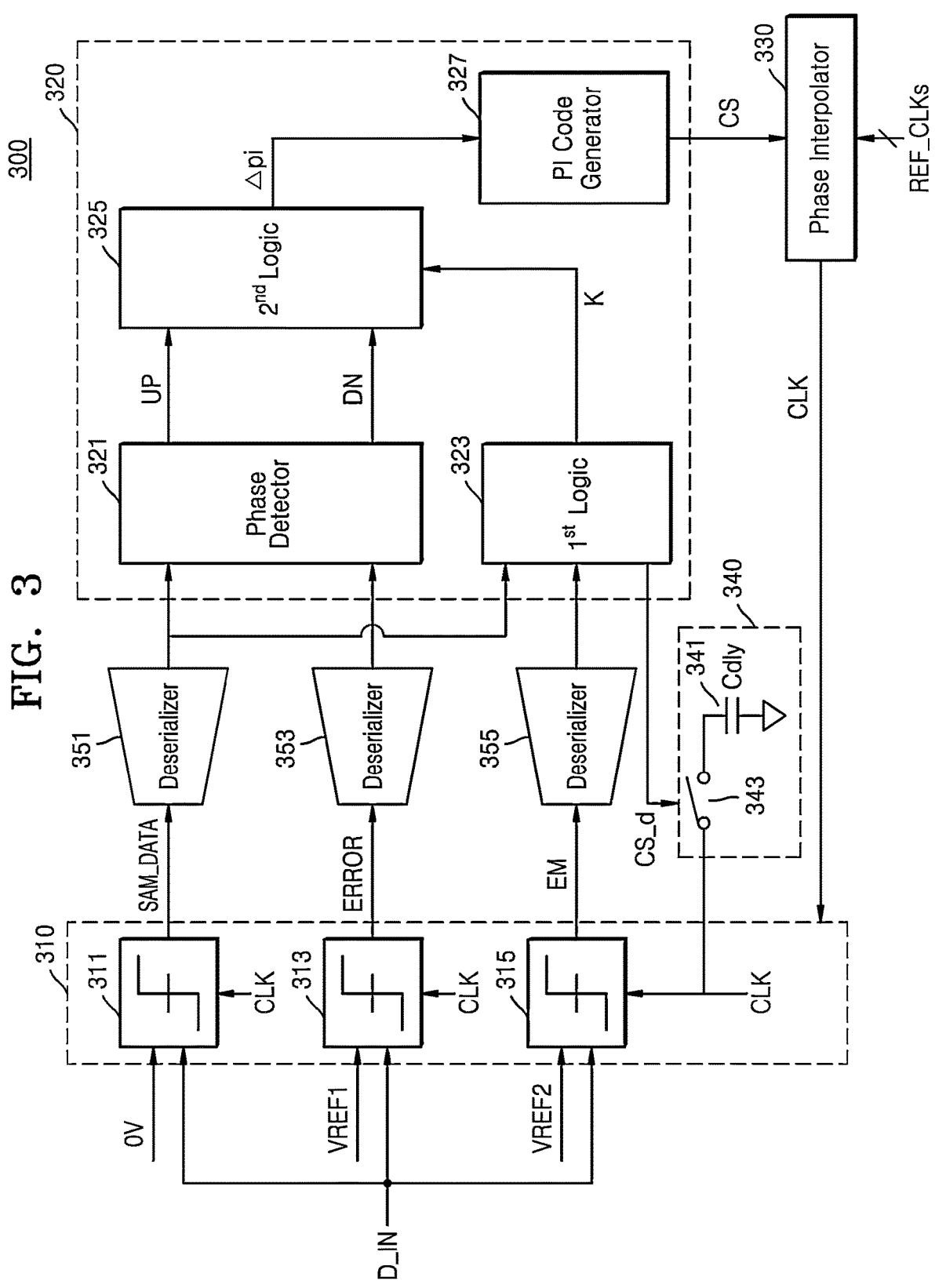
FIG. 3 is a block diagram illustrating a clock data recovery circuit according to an embodiment.

FIG. 3 is a block diagram illustrating a clock data recovery circuit 300 according to an embodiment.

Referring to FIG. 3, the clock data recovery circuit 300 may include a sampler 310, a control circuit 320, a phase interpolator 330 and a delay circuit 340. Descriptions of components similar to those shown in FIG. 2 may also be applied to FIG. 3.

The sampler 310 may include a first sampler 311, a second sampler 313 and a third sampler 315. Here, each of the first to the third samplers 311, 313, and 315 may be implemented as a comparison sampler.

The first sampler 311 may sample an input data signal D_IN in response to an edge of a recovered clock signal CLK and output a data sample signal SAM_DATA. The first sampler 311 may be referred to as a data sampler.

Here, the first sampler 311 may compare a reference voltage (e.g., 0 V) and a voltage level of the input data signal D_IN at the edge of the recovered clock signal CLK. As a result of the comparison, the first sampler 311 may output the data sample signal SAM_DATA corresponding to either a high level or a low level. For example, the data sample signal SAM_DATA may be a logical decision signal representing a difference between the voltage level of the input data signal D_IN and the reference voltage (e.g., 0 V) at the edge of the recovered clock signal CLK as a high level or a low level.

The second sampler 313 may compare the voltage level of the input data signal D_IN with a first reference voltage VREF1 in response to the edge of the recovered clock signal CLK and output an error signal ERROR indicating a result of the comparison. The second sampler 313 may be referred to as an error sampler.

Here, the second sampler 313 may compare the first reference voltage VREF1 and the voltage level of the input data signal D_IN at the edge of the recovered clock signal CLK. As a result of the comparison, the second sampler 313 may output the error signal ERROR corresponding to either a high level or a low level. For example, the error signal ERROR may be a logical decision signal representing a difference between the voltage level of the input data signal D_IN and the first reference voltage VREF1 at the edge of the recovered clock signal CLK as a high level or a low level.

In addition, the first reference voltage VREF1 may be provided to the second sampler 313 from the control circuit 320, and the first reference voltage VREF1 may change until the recovered clock signal CLK is locked.

In some embodiments, when the recovered clock signal CLK is locked, the first reference voltage VREF1 may have a voltage level corresponding to $h_0$. Here, $h_0$ represents a value of a main cursor in a composite pulse response.

The third sampler 315 may compare the voltage level of the input data signal D_IN with the second reference voltage VREF2 in response to the edge of the recovered clock signal CLK or an edge of the delayed recovered clock signal CLK_d and output an eye monitoring signal EM indicating a result of the comparison. The third sampler 315 may be referred to as an eye monitoring sampler.

Here, in response to a turn-off or a turn-on of a switch 343 included in the delay circuit 340, the third sampler 315 may compare the second reference voltage VREF2 and the voltage level of the input data signal D_IN at the edge of the recovered clock signal CLK, or the third sampler 315 may compare the second reference voltage VREF2 and the voltage level of the input data signal D_IN at the edge of the delayed recovered clock signal CLK_d. As a result of the comparison, the third sampler 315 may output the eye monitoring signal EM corresponding to either a high level or a low level. For example, the eye monitoring signal EM may be a logical decision signal representing a difference between the voltage level of the input data signal D_IN and the second reference voltage VREF2 at the edge of the recovered clock signal CLK or the edge of the delayed recovered clock signal CLK_d as a high level or a low level.

In addition, the second reference voltage VREF2 may be provided to the third sampler 315 from the control circuit 320, and the second reference voltage VREF2 may change until the recovered clock signal CLK is locked.

In some embodiments, when the recovered clock signal CLK is locked, the second reference voltage VREF2 may have a voltage level corresponding to $h_0$-$h_1$-$h_{-1}$. Here, $h_0$ represents the value of the main cursor in the composite pulse response, $h_1$ represents a value of a first post-cursor in the composite pulse response, and $h_{-1}$ represents a value of a first pre-cursor in the composite pulse response.

In some embodiments, the clock data recovery circuit 300 may further include a first deserializer 351, a second deserializer 353, and a third deserializer 355. Here, the first to third deserializers 351, 353 and 355 may receive the input data signal D_IN including a bit sequence and generate an output data signal including parallel data.

The first deserializer 351 may sequentially receive one data sample signal SAM_DATA from the first sampler 311 a plurality of times, and output a parallelized data sample signal. For example, the parallelized data sample signal is a signal obtained by parallelizing a plurality of the data sample signals SAM_DATA. Here, the information indicated by the parallelized data sample signal corresponds to the information indicated by the plurality of the data sample signals SAM_DATA.

The second deserializer 353 may sequentially receive one error signal ERROR from the second sampler 313 a plurality of times, and output a parallelized error signal. For example, the parallelized error signal is a signal obtained by parallelizing a plurality of the error signals ERROR. Here, the information indicated by the parallelized error signal corresponds to the information indicated by the plurality of the error signals ERROR.

The third deserializer 355 may sequentially receive one eye monitoring signal EM from the third sampler 315 a plurality of times, and output a parallelized eye monitoring signal. For example, the parallelized eye monitoring signal is a signal obtained by parallelizing a plurality of the eye monitoring signals EM. Here, the information indicated by the parallelized eye monitoring signal corresponds to the information indicated by the plurality of the eye monitoring signals EM.

The control circuit 320 may include a phase detector 321, a first logic 323, a second logic 325 and a phase interpolator (PI) code generator 327.

The phase detector 321 may receive signals from samplers (e.g., the first sampler 311 and the second sampler 313) and determine whether a data signal and a clock signal are matched or whether the clock signal precedes or follows the data signal. Based on changes in output values from the samplers (e.g., the first sampler 311 or the second sampler 313) received during a pre-defined unit interval (UI), the phase detector 321 may determine whether the clock signal is locked or whether the clock signal precedes or follows the data signal. For example, the phase detector 321 may compare the recovered clock signal CLK and a transition of the input data signal D_IN, thereby determining whether a phase of the recovered clock signal CLK leads or lags compared to the input data signal D_IN. In addition, the phase detector 321 may be referred to as a phase detection logic.

In some embodiments, the phase detector 321 may be implemented as a Mueller-Muller phase detector (MMPD).

The phase detector 321 may receive the parallelized data sample signal and the parallelized error signal as input values, and output a down signal DN indicating that the recovered clock signal CLK has an early phase or an up signal UP indicating that the recovered clock signal CLK has a late phase. Here, the parallelized data sample signal may be provided from the first deserializer 351, and the parallelized error signal may be provided from the second deserializer 353, but the inventive concept is not limited thereto.

In other embodiments, the phase detector 321 may receive the data sample signal SAM_DATA and the error signal ERROR from the first sampler 311 and the second sampler 313, respectively, without passing through the first deserializer 351 and the second deserializer 353. For example, the phase detector 321 may output the up signal UP or the down signal DN based on the data sample signal SAM_DATA and the error signal ERROR.

Each component of the control circuit 320 such as the phase detector 321, the first logic 323, the second logic 325 and the phase interpolator (PI) code generator 327 may be implemented in hardware as a circuit. Moreover, each component of the clock data recovery circuit 300 such as the sampler 310 and the phase interpolator 330 may be implemented in hardware as a circuit.

Figure 4A:
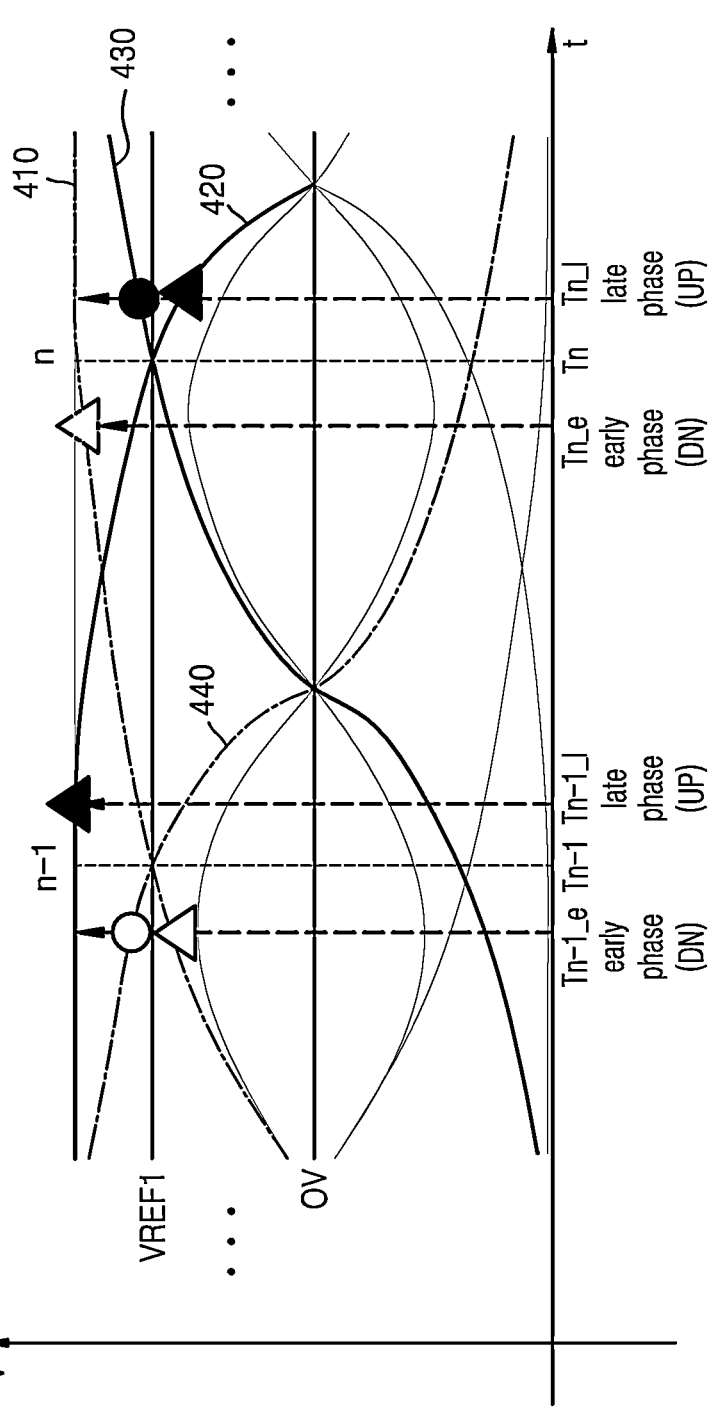

FIGS. 4A and 4B are diagrams for describing operations of a phase detector according to an embodiment.

For convenience of explanation, a value presented by a data sample signal SAM_DATA is referred to as a data sample D, and a value presented by an error signal ERROR is referred to as an error sample E.

FIG. 4A is a diagram overlappingly illustrating waveforms (voltage levels) v of a data input signal D_IN inputted to the first sampler 311 and the second sampler 313 over time t, and FIG. 4B is a diagram illustrating output signals of the phase detector PD 321 according to a current data sample Dn, a preceding data sample Dn−1, a current error sample En, and a preceding error sample En−1.

Referring to FIG. 4A, if a voltage level of the data input signal D_IN is higher than 0 V at an edge of a recovered clock signal CLK, the data sample D may have a value of 1. In addition, if the voltage level of the data input signal D_IN is lower than 0 V at the edge of the recovered clock signal CLK, the data sample D may have a value of −1.

If the voltage level of the data input signal D_IN is higher than a first reference voltage VREF1 at the edge of the recovered clock signal CLK, the error sample E may have a value of 1. In addition, if the voltage level of the data input signal D_IN is lower than the first reference voltage VREF1 at the edge of the recovered clock signal CLK, the error sample E may have a value of −1. In some embodiments, the first reference voltage VREF1 may be a voltage level corresponding to $h_0$. Here, $h_0$ represents a value of a main cursor in a composite pulse response.

The phase detector 321 may output a down signal DN or an up signal UP based on the current data sample Dn, the preceding data sample Dn−1, the current error sample En, and the preceding error sample En−1. Here, the down signal DN may indicate that the recovered clock signal CLK has an early phase, and the up signal UP may indicate that the recovered clock signal CLK has a late phase. However, the inventive concept is not limited thereto, and the down signal DN may indicate that the recovered clock signal CLK has the late phase, and the up signal UP may indicate that the recovered clock signal CLK has the early phase.

For example, the phase detector 321 may be implemented as a look-up table. The look-up table may map the up signal UP or the down signal DN that corresponds to the current data sample Dn, the preceding data sample Dn−1, the current error sample En, and the preceding error sample En−1. In some embodiments, the look-up table may be implemented as a memory. In some embodiments, the look-up table may include a plurality of registers. The look-up table may include a multiplexer for outputting values that are stored in at least some of the plurality of registers as the up signal UP or the down signal DN based on the current data sample Dn, the preceding data sample Dn−1, the current error sample En, and the preceding error sample En−1.

Using the look-up table, the phase detector 321 may output the down signal DN or the up signal UP corresponding to the current data sample Dn, the preceding data sample Dn−1, the current error sample En, and the preceding error sample En−1.

Referring to FIGS. 4A and 4B, the phase detector 321 may output the down signal DN or the up signal UP based on the current data sample Dn, the preceding data sample Dn−1, the current error sample En, and the preceding error sample En−1 corresponding to four cases 410, 420, 430 and 440 shown in FIGS. 4A and 4B.

Referring to FIG. 4A, in a first case 410, the preceding data sample Dn−1 has a value of 1 since the voltage level of the data input signal D_IN is higher than 0 V at a preceding edge Tn−1_e of the recovered clock signal CLK having the early phase, and the current data sample Dn has a value of 1 since the voltage level of the data input signal D_IN is higher than 0 V at a current edge Tn_e of the recovered clock signal CLK having the early phase. In addition, the preceding error sample En−1 has a value of −1 since the voltage level of the data input signal D_IN is lower than the first reference voltage VREF1 at the preceding edge Tn−1_e of the recovered clock signal CLK having the early phase, and the current error sample En has a value of −1 since the voltage level of the data input signal D_IN is lower than the first reference voltage VREF1 at the current edge Tn_e of the recovered clock signal CLK having the early phase. For example, referring to FIG. 4B, the phase detector 321 may output the down signal DN in the first case 410.

Referring to FIG. 4A, in a second case 420, the preceding data sample Dn−1 has a value of 1 since the voltage level of the data input signal D_IN is higher than 0 V at a preceding edge Tn−1_1 of the recovered clock signal CLK having the late phase, and the current data sample Dn has a value of 1 since the voltage level of the data input signal D_IN is higher than 0 V at a current edge Tn_1 of the recovered clock signal CLK having the late phase. In addition, the preceding error sample En−1 has a value of 1 since the voltage level of the data input signal D_IN is higher than the first reference voltage VREF1 at the preceding edge Tn−1_1 of the recovered clock signal CLK having the late phase, and the current error sample En has a value of −1 since the voltage level of the data input signal D_IN is lower than the first reference voltage VREF1 at the current edge Tn_1 of the recovered clock signal CLK having the late phase. For example, referring to FIG. 4B, the phase detector 321 may output the up signal UP in the second case 420.

Referring to FIG. 4A, in a third case 430, the preceding data sample Dn−1 has a value of −1 since the voltage level of the data input signal D_IN is lower than 0 V at the preceding edge Tn−1_1 of the recovered clock signal CLK having the late phase, the current data sample Dn has a value of 1 since the voltage level of the data input signal D_IN is higher than 0 V at the current edge Tn_1 of the recovered clock signal CLK having the late phase, and the current error sample En has a value of 1 since the voltage level of the data input signal D_IN is higher than the first reference voltage VREF1 at the current edge Tn_1 of the recovered clock signal CLK having the late phase. For example, referring to FIG. 4B, the phase detector 321 may output the up signal UP in the third case 430.

Referring to FIG. 4A, in a fourth case 440, the preceding data sample Dn−1 has a value of 1 since the voltage level of the data input signal D_IN is higher than 0 V at the preceding edge Tn−1_e of the recovered clock signal CLK having the early phase, the current data sample Dn has a value of −1 since the voltage level of the data input signal D_IN is lower than 0 V at the current edge Tn_e of the recovered clock signal CLK having the early phase, and the preceding error sample En−1 has a value of 1 since the voltage level of the data input signal D_IN is higher than the first reference voltage VREF1 at the preceding edge Tn−1_e of the recovered clock signal CLK having the early phase. For example, referring to FIG. 4B, the phase detector 321 may output the down signal DN in the fourth case 440.

According to the inventive concept, phase errors of the four cases may be detected with a single error sampler (e.g., the second sampler 313) as the phase detector 321 outputs the down signal DN or the up signal UP based on the current data sample Dn, the preceding data sample Dn−1, the current error sample En, and the preceding error sample En−1 corresponding to the four cases 410, 420, 430 and 440 shown in FIG. 4B.

Thus, despite using one error sampler, the phase detector 321 according to the inventive concept may have the same transition density as a phase detector using two error samplers according to comparative examples (e.g., sign-sign MMPD (SS-MMPD)). The transition density here represents a frequency of signal level changes in a data signal.

Referring back to FIG. 3, the control circuit 320 may include the first logic 323 and the second logic 325. In some embodiments different from those shown in FIG. 3, the phase detector 321 may include the first logic 323 and the second logic 325.

The first logic 323 may receive signals from samplers (e.g., the second sampler 313 or the third sampler 315) and output a K signal K for adjusting a ratio between the up signal and the down signal.

For example, the first logic 323 may output the K signal K for adjusting the ratio between the up signal and the down signal. This way, an eye height (or a margin) is increased based on changes in output values of the samplers (e.g., the second sampler 311 or the third sampler 313), which are received during the pre-defined unit interval (UI), at a locking point of an eye pattern of the data signal according to the clock signal. As mentioned in describing FIG. 2, the locking point may represent a sampling timepoint of the recovered clock signal CLK with a phase ultimately determined. In addition, the first logic 323 may be referred to as an eye height monitoring algorithm.

The first logic 323 may receive the parallelized data sample signal and the parallelized eye monitoring signal as input values, and output the K signal K for adjusting the ratio between the up signal and the down signal. Here, the K signal K may indicate a value of a parameter K for adjusting the ratio between the up signal and the down signal. Hereinafter, it is assumed and described that the value of the parameter K is a positive number.

In addition, the parallelized data sample signal may be provided from the first deserializer 351, and the parallelized eye monitoring signal may be provided from the third deserializer 355, but the inventive concept is not limited thereto.

In other embodiments, the first logic 323 may receive the data sample signal SAM_DATA and the eye monitoring signal EM from the first sampler 311 and the third sampler 315, respectively, without passing through the first deserializer 351 and the third deserializer 355. For example, the first logic 323 may output the K signal K based on the data sample signal SAM_DATA and the eye monitoring signal EM.

The first logic 323 may adjust the value of the parameter K based on output values of the data sample signal SAM-_DATA and the eye monitoring signal EM until the recovering clock signal CLK is locked. This is described in detail later.

The second logic 325 may receive the K signal K, the up signal UP and the down signal DN as input values, and adjust the ratio between the up signal UP and the down signal DN to output a phase error signal Δpi. Here, the phase error signal Δpi indicates a signal with the ratio of a received up signal UP and a received down signal DN adjusted to 1:K. The phase error signal Δpi may be expressed as Equation 1 below.

$$\Delta pi = K * DN - UP \qquad \text{[Equation 1]}$$

Here, Δpi represents a value of the phase error signal Δpi, DN represents a value of the down signal DN, UP represents a value of the up signal UP, and K represents a parameter for adjusting the ratio between the up signal and the down signal.

Here, if 0<K<1, a weight for a clock phase update of the up signal UP may be increased. If K=1, a weight for a clock phase update of each of the up signal UP and the down signal DN may be equalized. If K>1, the weight for the clock phase update of the down signal DN may be increased.

The PI code generator 327 may receive the phase error signal Δpi as an input value, and output a control signal CS which is a signal for controlling the phase of the recovered clock signal CLK.

According to an embodiment, the PI code generator 327 may receive the phase error signal Δpi from the second logic 325 and control the phase of the recovered clock signal CLK so that the input data signal D_IN and the recovered clock signal CLK are locked. If a value of the phase error signal Δpi is dithering near "0", the PI code generator 327 may determine that the input data signal D_IN and the recovered clock signal CLK are locked.

For example, when the value of the phase error signal Δpi received from the second logic 325 satisfies a predetermined value, the PI code generator 327 may control the phase of the recovered clock signal CLK by specifying a change in the value of a phase interpolation code to the phase interpolator

330. Here, the PI code generator 327 may output the control signal CS identifying the phase interpolation code to the phase interpolator 330.

The phase interpolator 330 may receive the control signal CS identifying the phase interpolation code from the PI code generator 327 and control the phase of the outputted recovered clock signal CLK. For example, the phase interpolator 330 may receive reference clock signals REF_CLKs including a plurality of phase clock signals from a phase locked loop (PPL). Based on the phase interpolation code, the phase interpolator 330 may generate a clock signal having a new phase by setting weights different between the plurality of phase clock signals. According to various embodiments, the phase interpolator 330 may be implemented as a delay lock loop (DLL).

The delay circuit 340 may include a capacitor 341 and the switch 343. The delay circuit 340 may be connected to a pathway of the recovered clock signal CLK applied to the third sampler 315. The delay circuit 340 may provide the recovered clock signal CLK or the delayed recovered clock signal CLK_D to the third sampler 315 based on the delay circuit control signal CS_d of the control circuit 300 (e.g., the first logic 323). Here, the delay circuit control signal CS_D may instruct the switch 343 to turn on or turn off.

Since the control circuit 320 may periodically repeat between the turn-off and the turn-on of the switch 343 included in the delay circuit 340, the control circuit 320 may dither the recovered clock signal CLK applied to the third sampler 315. For example, an edge timepoint of the recovered clock signal CLK applied to the third sampler 315 may become later or faster based on the turn-on or the turn-off of the switch 343.

Figure 5:
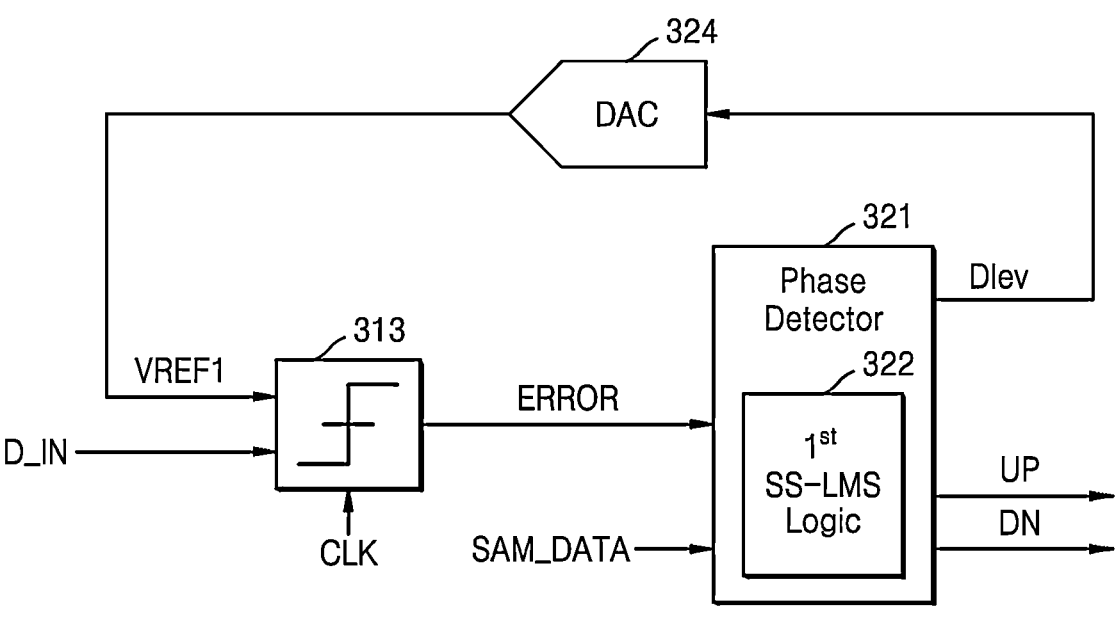
FIG. 5 is a diagram for describing a first reference voltage according to an embodiment.

FIG. 5 is a diagram for describing a first reference voltage VREF1 according to an embodiment.

Referring to FIG. 5, it can be seen that the second sampler 313 and the phase detector 321 described in FIG. 3 are shown. The clock data recovery circuit 300 may further include a first SS-LMS logic 322 and a first digital-to-analog converter 324. In addition, the phase detector 321 may include the first SS-LMS logic 322.

The first SS-LMS logic 322 may receive the error signal ERROR and the data sample signal SAM_DATA as input values, and output a first data level signal Dlev, which is a digital signal corresponding to the first reference voltage VREF1, employing a sign-sign least mean square (SS-LMS).

The first digital-to-analog converter 324 may receive the first data level signal Dlev as an input value, and output the first reference voltage VREF1 that is an analog signal.

The second sampler 313 may compare the first reference voltage VREF1 and the voltage level of the input data signal D_IN at the edge of the recovered clock signal CLK. As a result of the comparison, the second sampler 313 may output the error signal ERROR corresponding to either the high level or the low level. For example, the error signal ERROR may be a logical decision signal representing the difference between the voltage level of the input data signal D_IN and the first reference voltage VREF1 at the edge of the recovered clock signal CLK as a high level or a low level.

In addition, the first reference voltage VREF1 may be provided to the second sampler 313 from the first SS-LMS logic 322 through the first digital-to-analog converter 324, and the first reference voltage VREF1 may change until the recovered clock signal CLK is locked.

Adaptively employing the SS-LMS (sign-sign least mean square) to the error signal ERROR and the data sample signal SAM_DATA, the first SS-LMS logic 322 may output the first data level signal Dlev, which is a digital signal corresponding to the first reference voltage VREF1.

In some embodiments, when the recovered clock signal CLK is locked, the first reference voltage VREF1 may have least mean square) to the eye monitoring signal EM and the data sample signal SAM_DATA.

If applying SS-LMS in the case that $D_{n-1}=-1$, $D_n=1$, and $D_{n+1}=-1$, it is shown as Equation 2 below, $$\min\sum_n (y_n - w_0 x_n)^2 = \min(\ldots + h_{-1}x_{n+1} + h_0 x_n + h_1 x_{n-1} + \ldots - w_0 x_n)^2 \qquad \text{[Equation 2]}$$

$$= \min(\ldots - h_{-1} + h_0 - h_1 + \ldots - w_0)^2$$

a voltage level corresponding to $h_0$. Here, $h_0$ represents a value of a main cursor in a composite pulse response.

Figure 6:
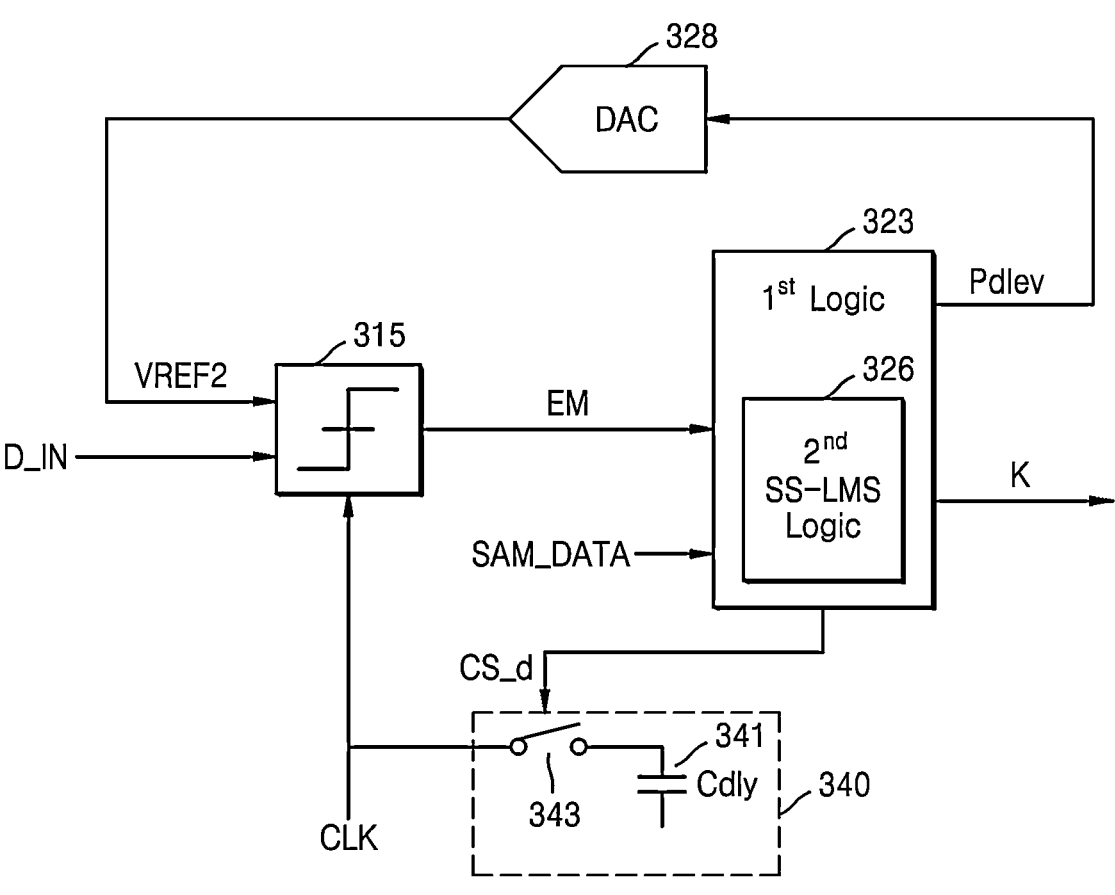
FIG. 6 is a diagram for describing a second reference voltage according to an embodiment.

FIG. 6 is a diagram for describing a second reference voltage VREF2 according to an embodiment.

Referring to FIG. 6, it can be seen that the third sampler 315, the first logic 323 and the delay circuit 340 described in FIG. 3 are shown. The clock data recovery circuit 300 may further include a second SS-LMS logic 326 and a second digital-to-analog converter 328. In addition, the first logic 323 may include the second SS-LMS logic 326.

The second SS-LMS logic 326 may receive the eye monitoring signal EM and the data sample signal SAM_DATA as input values, and output a second data level signal Pdlev, which is a digital signal corresponding to the second reference voltage VREF2, employing the SS-LMS (sign-sign least mean square).

The second digital-to-analog converter 328 may receive the second data level signal Pdlev as an input value, and output the second reference voltage VREF2 that is an analog signal.

In response to the turn-off or the turn-on of the switch 343 included in the delay circuit 340, the third sampler 315 may compare the second reference voltage VREF2 and the voltage level of the input data signal D_IN at the edge of the recovered clock signal CLK, or the third sampler 315 may compare the second reference voltage VREF2 and the voltage level of the input data signal D_IN at the edge of the delayed recovered clock signal CLK_d. As a result of the comparison, the third sampler 315 may output the eye monitoring signal EM corresponding to either the high level or the low level. For example, the eye monitoring signal EM may be a logical decision signal representing the difference between the voltage level of the input data signal D_IN and the second reference voltage VREF2 at the edge of the recovered clock signal CLK or the edge of the delayed recovered clock signal CLK_d as a high level or a low level.

Adaptively employing the SS-LMS (sign-sign least mean square) to the eye monitoring signal EM and the data sample signal SAM_DATA, the second SS-LMS logic 326 may output the second data level signal Pdlev, which is a digital signal corresponding to the second reference voltage VREF2.

In some embodiments, the second SS-LMS logic 326 may output the second data level signal Pdlev by employing the SS-LMS (sign-sign least mean square) to the eye monitoring signal EM and the data sample signal SAM_DATA based on a data pattern of the data sample signal SAM_DATA.

For example, only when values of three sequential data samples $D_{n-1}$, $D_n$, and $D_{n+1}$ of the data sample signal SAM-DATA are −1, 1, and −1, the second SS-LMS logic 326 may output the second data level signal Pdlev corresponding to the second reference voltage VREF2.

For example, only when $D_{n-1}=-1$, $D_n=1$, and $D_{n+1}=-1$, the second SS-LMS logic 326 may output the second data level signal Pdlev by employing the SS-LMS (sign-sign wherein, $y_n$ represents the data input signal D_IN, $x_n$ represents n-th data sample $D_n$, $w_0$ represents the second reference voltage VREF2, and $h_n$ represents an impulse response of a channel.

Since all the data samples other than $D_{n-1}=-1$, $D_n=1$, and $D_{n+1}=-1$ are random values, $w_0$ that satisfies Equation 2 is $h_0$-$h_1$-$h_{-1}$.

For example, a value of an eye-height may be determined by adjusting the second reference voltage VREF2 of an eye monitoring sampler (e.g., the third sampler 315) with the SS-LMS, using a pattern of −1, 1, and −1 which is a pattern of three data samples.

The second reference voltage VREF2 may be provided to the third sampler 315 from the second SS-LMS logic 326, and the second reference voltage VREF2 may change until the recovered clock signal CLK is locked.

Referring to Equation 2, when the recovered clock signal CLK is locked, the second reference voltage VREF2 may have a voltage level corresponding to $h_0$-$h_1$-$h_{-1}$. Here, $h_0$ represents a value of a main cursor in a composite pulse response, $h_1$ represents a value of a first post-cursor in the composite pulse response, $h_{-1}$ represents a value of a first pre-cursor in the composite pulse response.

Figure 7B:
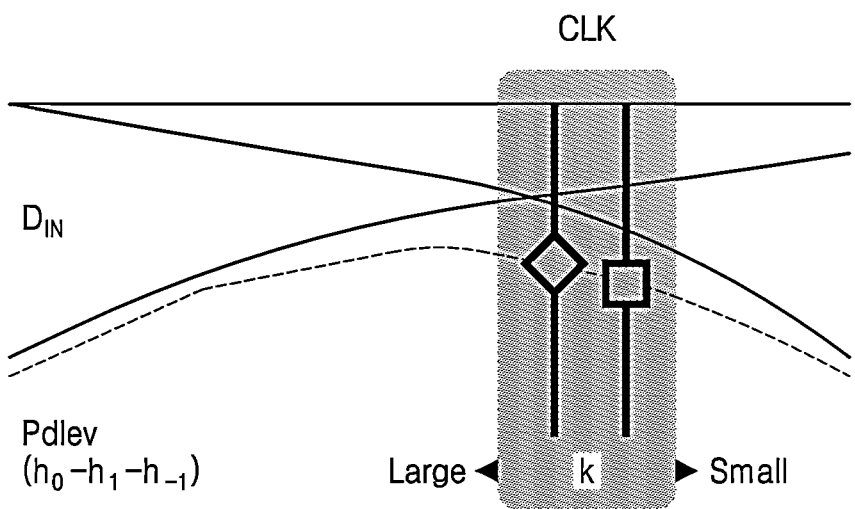
Figure 7C:
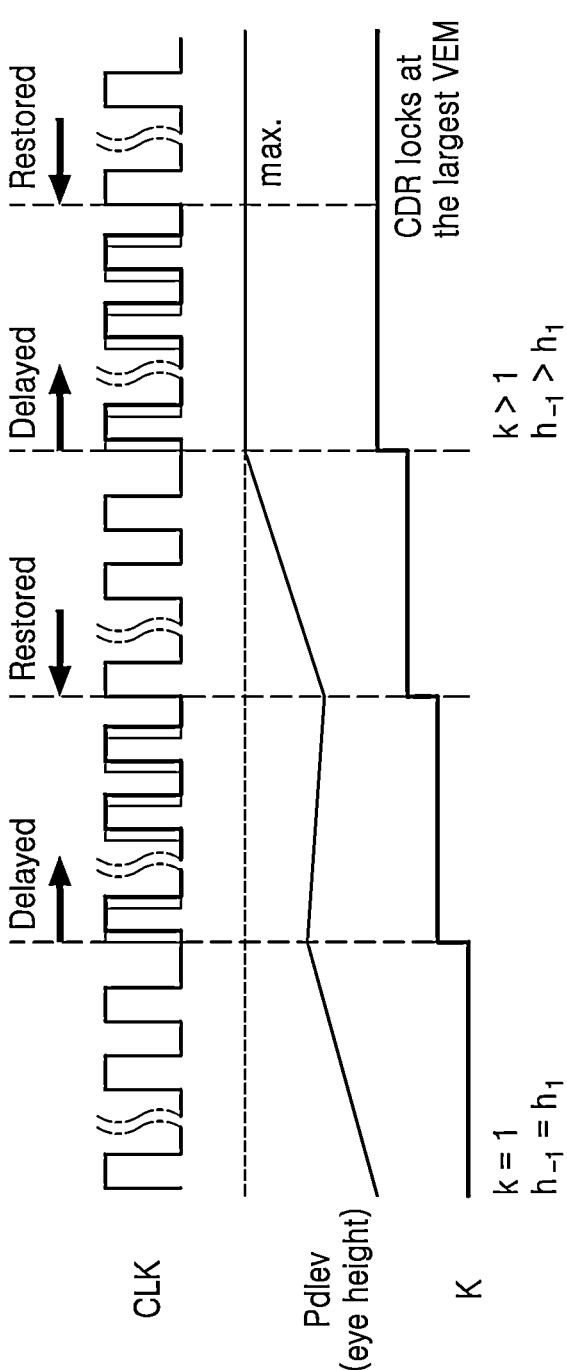

FIGS. 7A, 7B and 7C are diagrams for describing operations of a clock data recovery circuit 300 according to an embodiment.

The clock data recovery circuit 300 is described with the assumption that a recovered clock signal CLK is locked, with a value of K being set as 1.

The control circuit 320 (e.g., the first logic 323) may output the delay circuit control signal CS_d to the delay circuit 340 to allow the switch 343 to be periodically turned off or turned on. Accordingly, the control circuit 320 (e.g., the first logic 323) may dither the recovered clock signal CLK. For example, an edge timepoint of the recovered clock signal CLK applied to the third sampler 315 may become later or faster based on the turn-on or the turn-off of the switch 343.

By dithering the recovered clock signal CLK, the control circuit 320 (e.g., the first logic 323) may determine whether a value of the second data level signal Pdlev has increased or decreased. In addition, the control circuit 320 (e.g., the first logic 323) may adjust the value of K based on the value of the second data level signal Pdlev.

FIG. 7A is a diagram-illustrating whether the control circuit 320 (e.g., the first logic 323) increases or decreases the value of K according to an increase or a decrease of the value of the second data level signal Pdlev when the delayed recovered clock signal CLK_d or the recovered clock signal CLK is applied to the third sampler 315.

When the delayed recovered clock signal CLK_d is applied to the third sampler 315 since the switch 343 is turned on in response to the delay circuit control signal CS_d, the value of the second data level signal Pdlev may either increase or decrease. Here, when the value of the second data level signal Pdlev increases, the control circuit 320 (e.g., the first logic 323) may adjust the value of K so that the value of K decreases. When the value of the second data level signal Pdlev decreases, the control circuit 320 (e.g., the first logic 323) may adjust the value of K so that the value of K increases.

When the recovered clock signal CLK is applied to the third sampler 315 since the switch 343 is turned off in response to the delay circuit control signal CS_d, the value of the second data level signal Pdlev may either increase or decrease. Here, when the value of the second data level signal Pdlev increases, the control circuit 320 (e.g., the first logic 323) may adjust the value of K so that the value of K increases. When the value of the second data level signal Pdlev decreases, the control circuit 320 (e.g., the first logic 323) may adjust the value of K so that the value of K decreases.

FIG. 7B is a drawing illustrating a case in which the recovered clock signal CLK is locked where the eye pattern has a negative slope when the value of K is 1. FIG. 7C illustrates a process adjusting the value of K in the case illustrated in FIG. 7B.

Referring to FIGS. 7B and 7C, when the delayed recovered clock signal CLK_d is applied to the third sampler 315 since the switch 343 is turned on in response to the delay circuit control signal CS_d, the value of the second data level signal Pdlev decreases. At this time, the control circuit 320 (e.g., the first logic 323) may adjust the value of K so that the value of K increases.

Thereafter, when the recovered clock signal CLK is applied to the third sampler 315 since the switch 343 is turned off in response to the delay circuit control signal CS_d, the value of the second data level signal Pdlev increases. At this time, the control circuit 320 (e.g., the first logic 323) may adjust the value of K so that the value of K increases.

Thereafter, by repeating the aforementioned turn-off and the aforementioned turn-on of the switch 343, the control circuit 320 (e.g., the first logic 323) may adjust the value of K so that the value of K increases.

As a result, the control circuit 320 (e.g., the first logic 323) may adjust the value of K, increasing it until the value of the second data level signal Pdlev reaches its maximum.

The value of the second data level signal Pdlev here may correspond to a value of the eye height. For example, the second reference voltage VREF2 may correspond to the value of the eye height. For example, a voltage level of the second reference voltage VREF2 may be proportional to the value of the eye height at a locking point of the recovered clock signal CLK.

The clock data recovery circuit 300 of the inventive concept may obtain a maximum value of the eye height by adjusting the value of K using the method described above. In addition, the clock data recovery circuit 300 of the inventive concept may achieve a lower bit error rate (BER) by obtaining the maximum value of the eye height.

Figure 8:
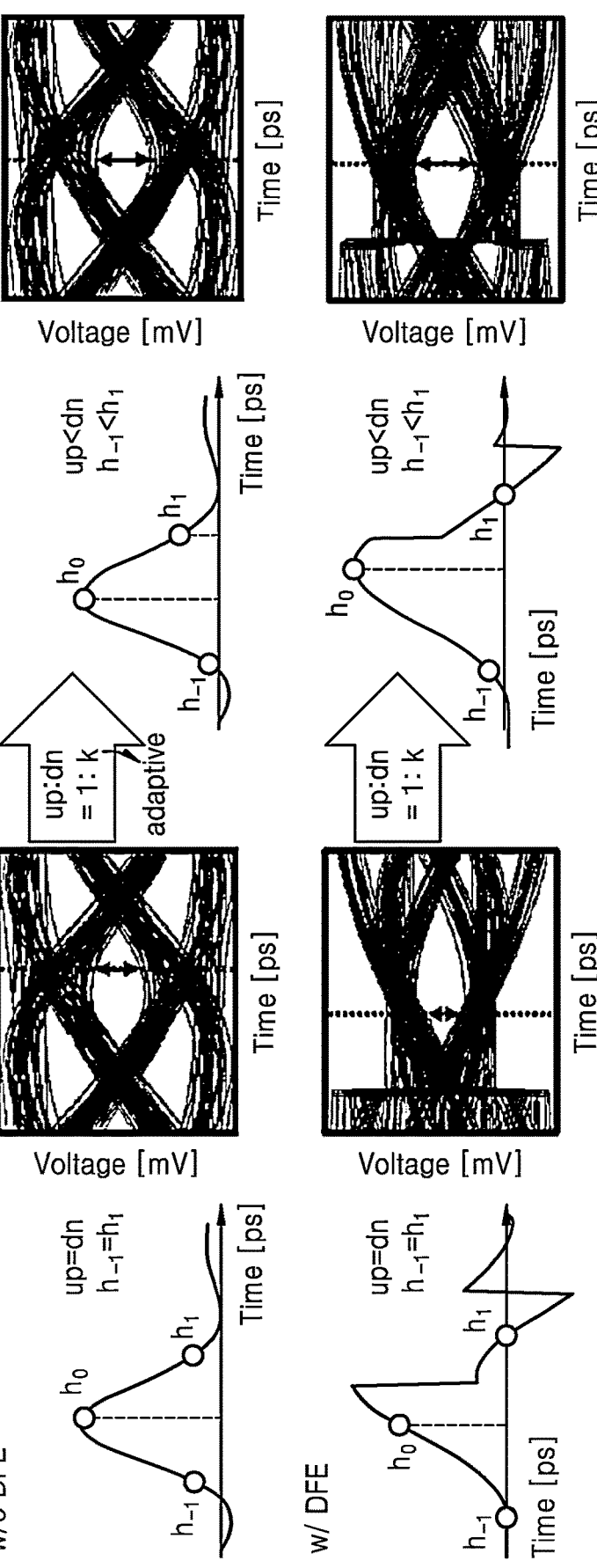
FIG. 8 is a diagram illustrating single-bit responses (SBR) and sampling timepoints of a clock data recovery circuit according to an embodiment.

FIG. 8 is a diagram illustrating single-bit responses (SBR) and sampling timepoints of the clock data recovery circuit 300 according to an embodiment.

The easiest way to check whether the clock data recovery circuit 300 according to an embodiment operates well even at high speed is to check whether the recovered clock signal CLK ultimately samples data at the highest point of a single-bit response (SBR) when viewed from the SBR.

In FIG. 8, SBR examples are illustrated having asymmetric characteristics due to large channel attenuation. FIG. 8 illustrates a case in which a data input signal is equalized by DFE and a case in which the data input signal is not equalized.

A unit on the horizontal axis is a unit interval (UI), which means one symbol cycle of input data. As a clock data recovery circuit according to a comparative example does not include an eye monitoring sampler (e.g., the third sample 315, the first logic 323, and the second logic 325), a value of $h_0$ may not be the maximum value since a cursor value before one UI $h_{-1}$ and a cursor value after one UI $h_1$ are locked to be the same. At this time, the value of K described above may be 1.

However, the clock data recovery circuit 300 according to an embodiment includes an eye monitoring sampler (e.g., the third sampler 315, the first logic 323, and the second logic 325), and may allow the value of $h_0$ to have the maximum value by adjusting the value of K in the method described above. At this time, the value of K described above may be adaptively changed.

Referring to FIG. 8, the clock data recovery circuit 300 according to an embodiment may lock at $h_0$ point, which is at a higher position when viewed from the SBR, and thus may have a better recovery performance. This difference becomes greater as the environment becomes faster and channel attenuation becomes more severe.

Figure 9:
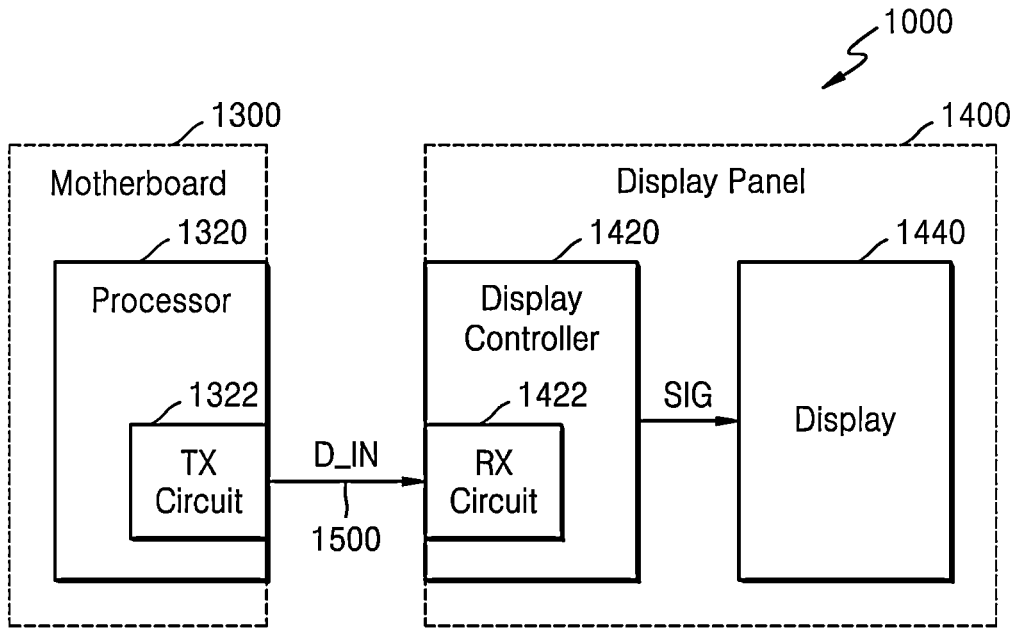
FIG. 9 is a block diagram illustrating an apparatus according to an embodiment.

FIG. 9 is a block diagram illustrating an apparatus 1000 according to an embodiment.

A clock data recovery circuit according to an embodiment may be included in a reception circuit 1422. The apparatus 1000 may be a computing system including a display panel 1400, or may be, as non-limiting examples, a stationary system such as desktop computers, servers, televisions, and electronic signages, or a mobile system such as laptop computers, mobile phones, tablet personal computers (PCs), and wearable devices. As illustrated in FIG. 9, the apparatus 1000 may include a motherboard 1300 and a display panel 1400, an input data signal D_IN may be delivered to the display panel 1400 from the motherboard 1300 through a data line 1500.

The motherboard 1300 may include a processor 1320 and the processor 1320 may include a transmission circuit 1322. The processor 1320 may refer to processing units for performing computational operations, such as a microprocessor, a microcontroller, an application specific integrated circuit (ASIC), and a field programmable gate array (FPGA). In some embodiments, the processor 1320 may be a video graphics processor such as a graphic processing unit (GPU). The processor 1320 may generate image data corresponding to images outputted through a display 1440 included in the display panel 1400 and the image data may be provided to the transmission circuit 1322.

The transmission circuit 1322 may output the input data signal D_IN to the reception circuit 1422 for clock data recovery operations of the reception circuit 1422. The display panel 1400 may include a display controller 1420 and the display 1440. The display controller 1420 may receive the input data signal D_IN from the motherboard 1300 and may perform clock data recovery operations using the input data signal D_IN. In some embodiments, the display controller 1420, which also may be referred to as a display driver integrate circuit (IC) (DDI), may provide a display signal SIG for controlling pixels included in the display 1440.

The display controller 1420 may include the reception circuit 1422 and the reception circuit 1422 may receive the input data signal D_IN. The reception circuit 1422 may include the clock data recovery circuit according to embodiments, and may generate recovered clocks and recovered data from the input data signal D_IN.

The display 1440 may include any type of display such as, as non-limiting examples, a liquid crystal display (LCD), a light emitting diode (LED), an electroluminescent display (ELD), a cathode ray tube (CRT), a plasma display panel (PDP), and a liquid crystal on silicon (LCoS). In addition, although the apparatus 1000 is illustrated to include one display panel 1400 in FIG. 9, the apparatus 1000 may include at least two display panels, e.g., at least two displays in some embodiments.

Figure 10:
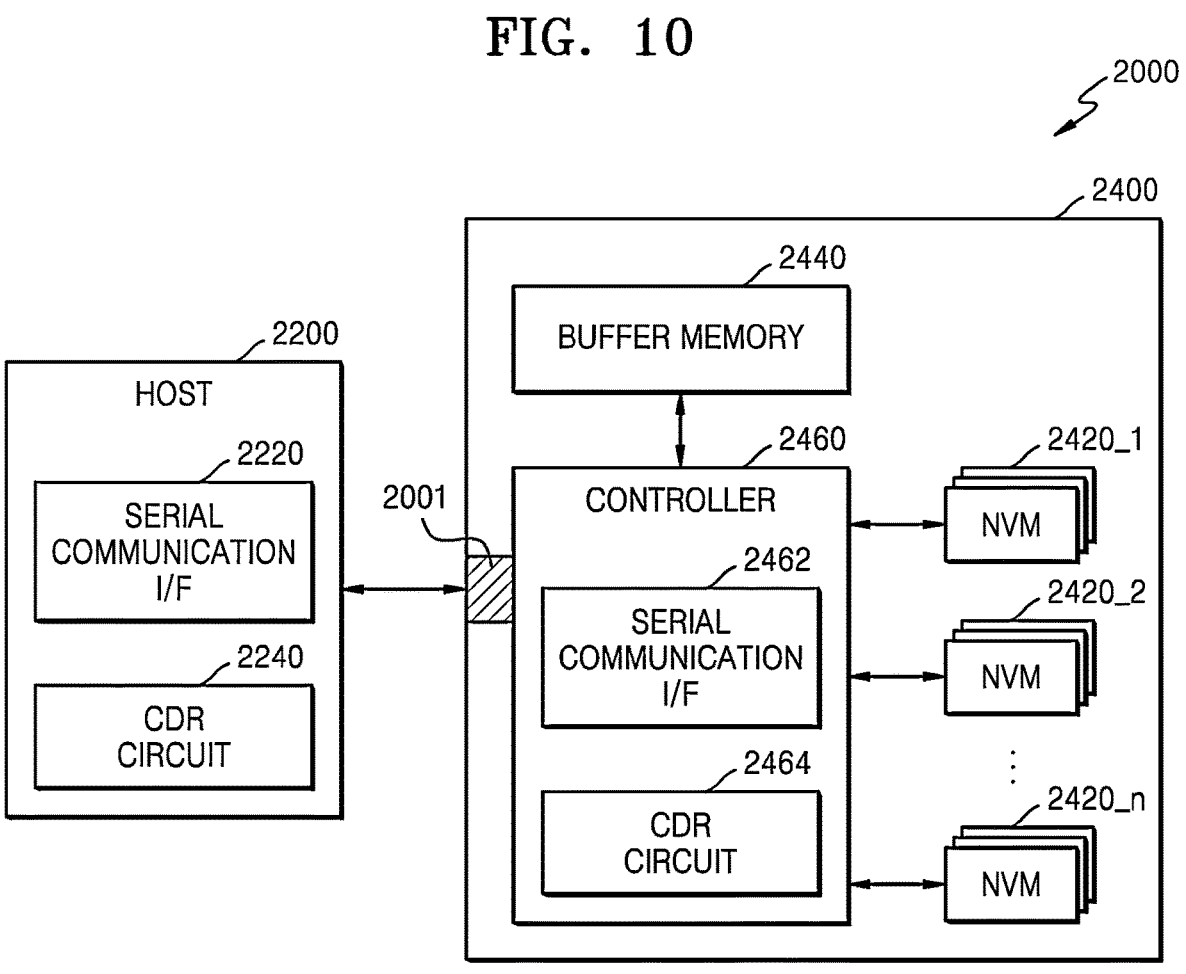
FIG. 10 is a block diagram illustrating a system according to an embodiment.

FIG. 10 is a block diagram illustrating a system 2000 according to an embodiment.

Referring to FIG. 10, the system 2000 may include a host 2200 and a storage device 2400. The storage device 2400 may be referred to as a memory system or a storage system, and may include a signal connector 2001, a plurality of non-volatile memories 2420_1 to 2420_n, a buffer memory 2440, and a controller 2460. For example, the controller 2460 may be referred to as a memory controller or a storage controller.

The storage device 2400 may transmit and receive signals with the host 2200 through the signal connector 2001. The host 2200 and the storage device 2400 may communicate through electrical signals and/or optical signals, and may communicate through, as non-limiting examples, a Universal Flash Storage (UFS), a Serial Advanced Technology Attachment (SATA), a SATA express (SATAe), a Small Computer Small Interface (SCSI), a Serial Attached SCSI (SAS), a Peripheral Component Interconnect express (PCIe), a Non-Volatile Memory express (NVMe), an Advanced Host Controller Interface (AHCI), or a combination thereof.

The controller 2460 may control the plurality of non-volatile memories 2420_1 to 2420_n in response to signals received from the host 2200. The controller 2460 may include a serial communication interface circuit 2462 for transmitting and receiving data, and may include a clock data recovery circuit 2464 of which embodiments are applied for recovering clocks and data of received serial data signals. The serial communication interface circuit 2462 may provide communication interfaces such as UFS, SATA, SATAe, SCSI, SAS, PCIe, NVMe, and AHCI. The buffer memory 2440 may be operated as a buffer memory of the storage device 2400. On the other hand, the host 2200 may also include a serial communication interface circuit 2220 for transmitting and receiving data and a clock data recovery circuit 2240 of which embodiments are applied.

Each of the non-volatile memories 2420_1 to 2420_n may include a memory cell array, the memory cell array may include memory blocks, each of the memory blocks may be divided into pages, and each of the pages may include non-volatile memory cells, such as, at least one NAND flash memory cell.

While the inventive concept has been particularly shown and described with reference to embodiments thereof, it will be understood that various changes in form and detail may be made thereto without departing from the spirit and scope of the inventive concept as set forth in the following claims.

What is claimed is:

1. A clock data recovery circuit comprising:
a sampler configured to sample a comparison result between an input data signal and multiple reference voltages or to sample the input data signal based on a recovered clock signal; and a control circuit configured to output a control signal for controlling a phase of the recovered clock signal based on a K signal, an up signal, and a down signal, wherein the sampler comprises:

a first sampler configured to output a data sample signal by sampling the input data signal at an edge of the recovered clock signal;

a second sampler configured to output an error signal by comparing a voltage level of the input data signal with a first reference voltage at the edge of the recovered clock signal; and a third sampler configured to output an eye monitoring signal by comparing the voltage level of the input data signal with a second reference voltage at the edge of the recovered clock signal or an edge of a delayed recovered clock signal, and the control circuit comprises:

a phase detector configured to output the up signal or the down signal based on the data sample signal and the error signal;

a first logic configured to output the K signal based on the data sample signal and the eye monitoring signal;

a second logic configured to output a phase error signal based on the K signal, the up signal, and the down signal; and a phase interpolator (PI) code generator configured to output the control signal based on the phase error signal.

2. The clock data recovery circuit of claim 1, wherein the K signal indicates a value of K for adjusting a ratio between the up signal and the down signal.

3. The clock data recovery circuit of claim 1, wherein the phase error signal comprises a signal based on Equation $\Delta pi = K*DN - UP$, and wherein $\Delta pi$ represents a value of the phase error signal, DN represents a value of the down signal, UP represents a value of the up signal, and K represents a parameter for adjusting a ratio between the up signal and the down signal.

4. The clock data recovery circuit of claim 1, further comprising a delay circuit configured to provide the recovered clock signal or the delayed recovered clock signal to the third sampler in response to a delay circuit control signal received from the control circuit.

5. The clock data recovery circuit of claim 4, wherein the control circuit dithers the recovered clock signal by outputting the delay circuit control signal to the delay circuit, and determines whether a value of a second data level signal corresponding to the second reference voltage increases or decreases.

6. The clock data recovery circuit of claim 1, wherein, when values of three sequential data samples $D_{n-1}$, $D_n$, and $D_{n+1}$ of the data sample signal are $-1$, $1$, and $-1$, the first logic outputs a second data level signal corresponding to the second reference voltage.

7. The clock data recovery circuit of claim 1, wherein, when the delayed recovered clock signal is applied to the third sampler and there is an increase in a value of a second data level signal corresponding to the second reference voltage, the first logic adjusts a value of K so that the K, which is a value of the K signal, decreases.

8. The clock data recovery circuit of claim 1, wherein, when the delayed recovered clock signal is applied to the third sampler and there is a decrease in a value of a second data level signal corresponding to the second reference voltage, the first logic adjusts a value of K so that the K, which is the value of the K signal, increases.

9. The clock data recovery circuit of claim 1, wherein a voltage level of the second reference voltage is proportional to a value of an eye height at a locking point of the recovered clock signal.

10. An apparatus comprising:

a reception circuit; and a transmission circuit configured to transmit an input data signal to the reception circuit through a channel, wherein the reception circuit comprises:

a sampler configured to sample a comparison result between the input data signal and multiple reference voltages or to sample the input data signal based on a recovered clock signal; and a control circuit configured to output a control signal for controlling a phase of the recovered clock signal based on a K signal, an up signal, and a down signal, wherein the sampler comprises:

a first sampler configured to output a data sample signal by sampling the input data signal at an edge of the recovered clock signal;

a second sampler configured to output an error signal by comparing a voltage level of the input data signal with a first reference voltage at the edge of the recovered clock signal; and a third sampler configured to output an eye monitoring signal by comparing the voltage level of the input data signal with a second reference voltage at the edge of the recovered clock signal or an edge of a delayed recovered clock signal, and the control circuit comprises:

a phase detector configured to output the up signal or the down signal based on the data sample signal and the error signal;

a first logic configured to output the K signal based on the data sample signal and the eye monitoring signal;

a second logic configured to output a phase error signal based on the K signal, the up signal, and the down signal; and a phase interpolator (PI) code generator configured to output the control signal based on the phase error signal.

11. The apparatus of claim 10, wherein the K signal indicates a value of K for adjusting a ratio between the up signal and the down signal.

12. The apparatus of claim 10, wherein the phase error signal comprises a signal based on Equation $\Delta pi = K*DN-UP$, and wherein $\Delta pi$ represents a value of the phase error signal, DN represents a value of the down signal, UP represents a value of the up signal, and K represents a parameter for adjusting a ratio between the up signal and the down signal.

13. The apparatus of claim 10, further comprising a delay circuit configured to provide the recovered clock signal or the delayed recovered clock signal to the third sampler in response to a delay circuit control signal received from the control circuit.

14. The apparatus of claim 13, wherein the control circuit dithers the recovered clock signal by outputting the delay circuit control signal to the delay circuit, and determines whether a value of a second data level signal corresponding to the second reference voltage increases or decreases.

15. The apparatus of claim 10, wherein, when values of three sequential data samples $D_{n-1}$, $D_n$, and $D_{n+1}$ of the data sample signal are −1, 1, and −1, the first logic outputs a second data level signal corresponding to the second reference voltage.

16. The apparatus of claim 10, wherein, when the delayed recovered clock signal is applied to the third sampler and there is an increase in a value of a second data level signal corresponding to the second reference voltage, the first logic adjusts a value of K so that the K, which is a value of the K signal, decreases.

17. The apparatus of claim 10, wherein, when the delayed recovered clock signal is applied to the third sampler and there is a decrease in a value of a second data level signal corresponding to the second reference voltage, the first logic adjusts a value of K so that the K, which is the value of the K signal, increases.

18. The apparatus of claim 10, wherein a voltage level of the second reference voltage is proportional to a value of an eye height at a locking point of the recovered clock signal.

19. A phase detector comprising:

a phase detection circuit configured to output an up signal or a down signal based on a data sample signal and an error signal;

a first circuit configured to output a K signal based on the data sample signal and an eye monitoring signal; and a second circuit configured to output a phase error signal based on the K signal, the up signal, and the down signal.

20. The phase detector of claim 19, wherein the K signal indicates a value of K for adjusting a ratio between the up signal and the down signal.

* * * * *